United States Patent [19]

Ahlgren

[11] Patent Number: 4,987,855
[45] Date of Patent: Jan. 29, 1991

[54] REACTOR FOR LASER-ASSISTED CHEMICAL VAPOR DEPOSITION

[75] Inventor: William L. Ahlgren, Goleta, Calif.

[73] Assignee: Santa Barbara Research Center, Goleta, Calif.

[21] Appl. No.: 484,642

[22] Filed: Nov. 9, 1989

[51] Int. Cl.[5] .............................................. C23C 16/48
[52] U.S. Cl. ................................... 118/722; 118/715; 118/726; 118/730; 427/53.1; 427/54.1
[58] Field of Search ............... 118/715, 722, 723, 726, 118/728, 730, 50.1; 427/53.1, 54.1; 219/273, 275

[56] References Cited

U.S. PATENT DOCUMENTS

| | | | |
|---|---|---|---|
| 4,260,649 | 4/1981 | Denison et al. | 427/53.1 |
| 4,558,660 | 12/1985 | Nishizawa et al. | 118/50.1 |
| 4,657,777 | 4/1987 | Hirooka et al. | 427/39 |
| 4,664,057 | 5/1987 | Hemmati | 118/50.1 |
| 4,702,936 | 10/1987 | Maeda et al. | 427/54.1 |
| 4,732,793 | 3/1988 | Itoh | 118/723 |

FOREIGN PATENT DOCUMENTS

| | | | |
|---|---|---|---|
| 54-20971 | 2/1979 | Japan | 118/715 |
| 57-17134 | 1/1982 | Japan | 156/345 |
| 59-82732 | 5/1984 | Japan | |
| 60-16416 | 1/1985 | Japan | 118/723 |
| 61-196525 | 8/1986 | Japan | 118/722 |
| 62-163332 | 7/1987 | Japan | 118/723 |
| 62-290873 | 12/1987 | Japan | 118/728 |
| 63-166216 | 7/1988 | Japan | 118/723 |
| 802414 | 2/1981 | U.S.S.R. | |

Primary Examiner—Norman Morganstern
Assistant Examiner—Terry J. Owens
Attorney, Agent, or Firm—W. C. Schubert; W. K. Denson-Low

[57] ABSTRACT

A reactor for laser-assisted CVD has a cylindrical symmetry and includes a high-speed horizontal rotating disk susceptor. The reactor of the invention provides for radiation, preferably UV laser radiation, to be introduced into the reactor radially along an axis. The radiation is constrained to occupy a thin region of space at or immediately adjacent to substrate surfaces upon which deposition is to occur. Preferably the radiation is provided as an annular beam that is reflected uniformly by a conical reflector to provide a relatively thin and uniform sheet of UV radiation that is approximately 0.1 mm to approximately 1.0 mm thick. In addition the reactor provides for Hg vapor, or any other gaseous reactant, to be introduced into the reactor at a same point on the axis as the laser radiation, separately from other reactants, and from a source coaxially disposed and external to the reactor.

13 Claims, 2 Drawing Sheets

REACTOR FOR LASER-ASSISTED CHEMICAL VAPOR DEPOSITION

FIELD OF THE INVENTION

This invention relates generally to semiconductor fabrication apparatus and method and, in particular, to apparatus and method for performing laser-assisted Chemical Vapor Deposition (CVD), in particular Metal-Organic Chemical Vapor Deposition (MOCVD).

BACKGROUND OF THE INVENTION

MOCVD reactors that utilize vertical flow, high speed horizontally rotating substrates are known in the art. However, known types of such conventional reactors exhibit several significant disadvantages. One disadvantage relates to an inability to readily employ ultraviolet (UV) radiation for laser-assisted growth and in-situ etching. Another disadvantage relates to a large mercury consumption and to a required heating of the reactor walls due to a requirement that the entire reactor volume be filled with a desired partial pressure of mercury. Another disadvantage is related to a non-optimum mercury injection flow dynamic. In that CVD and in particular MOCVD are important fabrication methodologies for producing high quality semiconductor materials containing Hg, such as Group II-VI semiconductor devices comprised of mercury-cadmium-telluride (HgCdTe), overcoming the deficiencies of the conventional vertical flow, horizontally rotating substrate reactor is an important goal.

It is thus one object of the invention to provide a CVD reactor having a horizontally rotating substrate support that employs laser radiation to achieve relatively low temperature growth and laser-stimulated in-situ etching.

It is another object of the invention to provide a horizontally rotating CVD reactor that does not require that the entire reactor volume be filled with Hg in order to maintain a desired pressure of Hg in the growth zone, thereby reducing Hg consumption and avoiding a requirement of heating the reactor walls.

It is a further object of the invention to provide a horizontally rotating CVD reactor that exhibits an intrinsically stable gas flow dynamic due to an optimum injection of Hg into the reactor.

It is a further object of the invention to provide Hg injection in a manner that avoids contact with stainless steel, thereby eliminating possible contamination of the Hg and the grown semiconductor layers.

It is a still further object of the invention to avoid gas-phase interactions between reactive species created by laser photodissociation by restricting the illuminated volume to a thin region adjacent to the substrate, the illuminated volume being preferably less than one mean free path in thickness.

SUMMARY OF THE INVENTION

The foregoing problems are overcome and the objects of the invention are realized by a reactor for laser-assisted CVD having a cylindrical symmetry and including a horizontally rotating disk susceptor. The reactor of the invention provides for radiation, preferably UV laser radiation, to be introduced into the reactor radially along an axis. The radiation is constrained to occupy a thin disk-shaped region of space at or immediately adjacent and parallel to substrate surfaces upon which deposition is to occur. Preferably the radiation is provided as an annular beam that is reflected uniformly by a reflector to provide a relatively thin and uniform sheet of UV radiation that is approximately 0.1 mm to approximately 1.0 mm thick. The annular beam of UV radiation is disposed at or closely adjacent to a surface of the substrate. In addition the reactor of the invention provides for Hg vapor, or any other gaseous reactant, to be introduced into the reactor at a position on the axis with the laser radiation, separately from other reactants, and from a source coaxially disposed and external to the reactor.

In accordance with a method of the invention there is taught a method of depositing a desired material upon a surface of a substrate. The method includes the steps of providing the substrate upon a top surface of a horizontally disposed substrate holder and rotating the substrate holder about a rotational axis thereof, the rotational axis being substantially perpendicular to the top surface. While the holder is rotated the method includes the following steps of (a) flowing a gas stream including at least one and typically more than one first type of reactant molecules toward the substrate, (b) providing a substantially planar beam of radiation parallel to and at or immediately adjacent to a top surface of the substrate, and (c) photolysing with the planar beam of radiation the first type of reactant molecules entering the planar beam to generate reactive fragments. From the reactive fragments the desired material is produced and deposited upon the top surface of the substrate. Preferably the planar beam is provided with a thickness that is less than a distance of one mean free path for collision between two of the reactive fragments. The method also includes a step of maintaining a desired pressure of a second type of reactant molecules over the substrate, the step of maintaining including a step of flowing a gas including the second type of reactant molecules out of an orifice within the substrate support.

The invention also teaches an ultraviolet radiation delivery apparatus for use in a chemical vapor deposition chamber. The delivery apparatus includes a first tubular member having a longitudinal axis, the first tubular member being comprised of a material substantially transparent to ultraviolet radiation. The first tubular member includes a first end for coupling to a source of ultraviolet radiation and a second end. The delivery apparatus further includes a conically-shaped reflector coupled to the second end and having an apex substantially coincident with the longitudinal axis, the reflector reflecting an annular beam of ultraviolet radiation into a substantially disk-shaped planar beam of radiation that passes out of the first tubular member.

BRIEF DESCRIPTION OF THE DRAWING

The above set forth and other features of the invention are made more apparent in the ensuing Detailed Description of the Invention when read in conjunction with the attached Drawing, wherein.

DETAILED DESCRIPTION OF A PREFERRED EMBODIMENT OF THE INVENTION

Figure 1A:
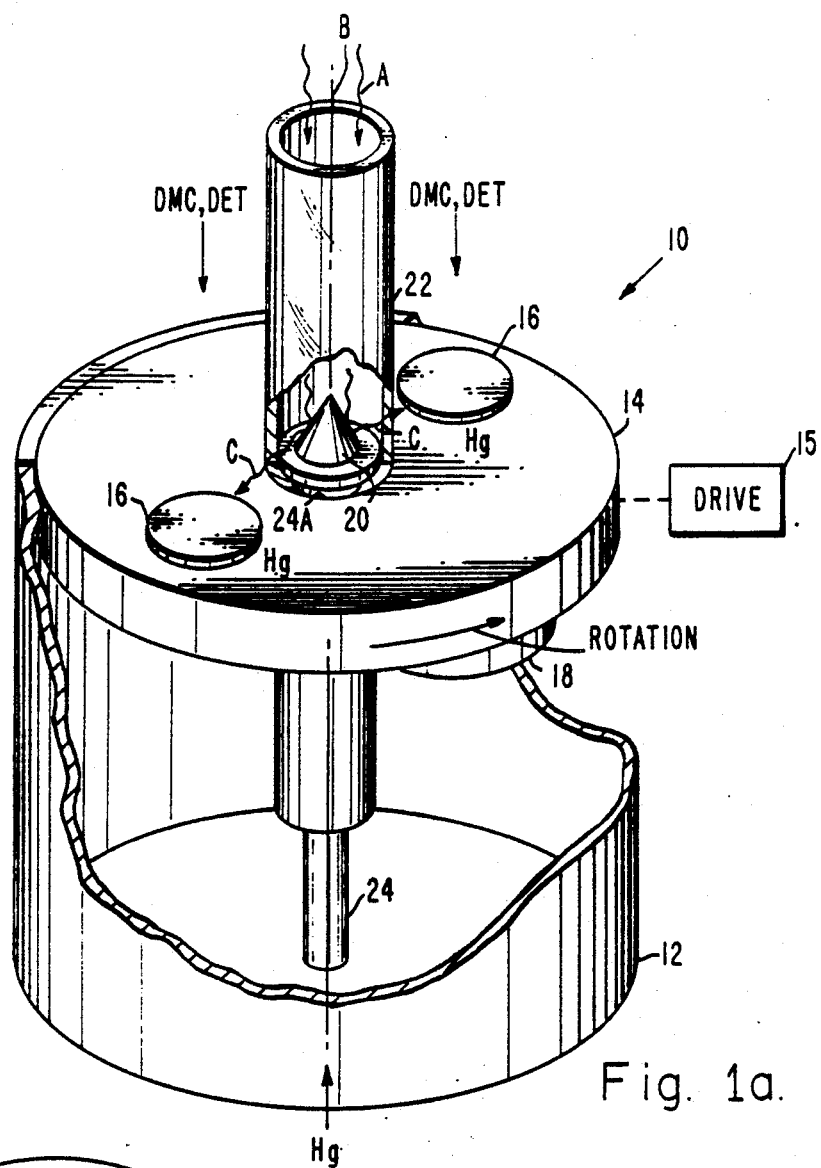
FIG. 1A is a simplified elevational view of a rotating substrate platform, or susceptor, constructed and operated in accordance with the invention.
Figure 2A:
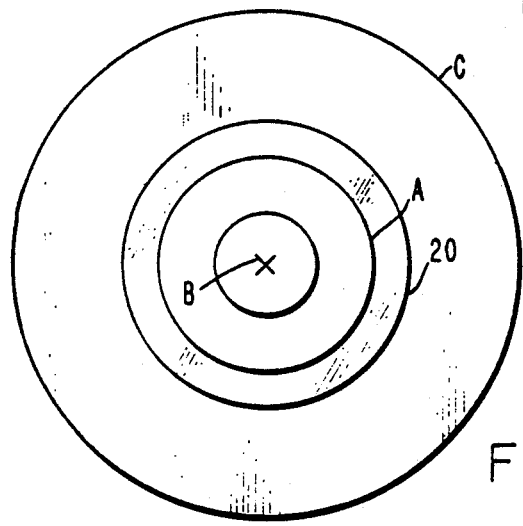
FIG. 2A is a top view showing an annular or toroidally shaped pulse of laser radiation directed down upon a top surface of a conical reflector.

Referring to FIG. 1 a reactor 10 includes a cylindrical stainless steel chamber 12, shown in cut-away form, that is compatible with high vacuum and also reactive flows at pressures up to, typically, one atmosphere. Chamber 12 contains a horizontally rotating disk-shaped platform or susceptor 14 on which substrates 16 for CVD are placed. It is understood that the substrates 16 themselves do not form a part of the invention and are shown only for reference purposes. Susceptor 14 is heated by proximity to a resistive heating element 18. Susceptor 14 is coupled to drive apparatus 15 for rotating the susceptor 14 at speeds of up to 500 rpm or greater. The foregoing features of a vertically disposed CVD reactor are known to practitioners in the art, and are provided to ensure reliable leak-free operation, to allow scale-up to high throughput operation, and to obtain high deposition efficiency and uniformity.

In accordance with the invention the reactor 10 further incorporates the novel features described below. A pulsed or cw source of radiation, such as an excimer laser (not shown), provides a beam A of radiation that is introduced into the reactor 10 from the top and through an optical conduit along a reactor 10 axis B. One suitable range of wavelengths for the radiation is within the range of approximately 190 nm to approximately 450 nm. A conical mirror 20 intercepts the beam A and causes the beam A to be spread out radially. As seen in greater detail in FIG. 3 the conical mirror 20 is housed within a cylindrical transparent quartz window 22 that is purged by a flow of gas, typically $H_2$, carried through a surrounding stainless steel tube 23. The UV radiation is provided in the form of toroidally-shaped plane waves, as can be derived from suitably designed unstable resonator optics. The diameter and thickness of the beam A is optically manipulated by lenses, mirrors and/or other suitable optical devices disposed external to the reactor 10 such that after reflection from the conical mirror 20 the beam A forms a substantially planar disk-shaped beam C having a thickness (T) typically within a range of approximately 0.1 mm to approximately 1.0 mm. As can be seen in FIGS. 1A, 1B, 2A, 2B and 3 the conical mirror 20 is positioned within the reactor 10 such that an apex of the mirror 20 is substantially coincident with the axis B so that the thin disk C of UV radiation passes substantially parallel to the substrates 16 and at or closely adjacent to a top surface upon which deposition is occurring. This prevents undesirable gas-phase reactions since reactant decomposition occurs only within one mean-free-path of the substrate 16 surface; thus reactive species (radicals) interact with the substrate 16 and not with one another.

Figure 1B:
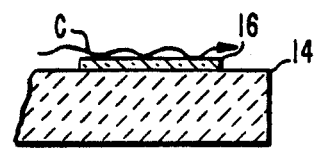
FIG. 1B is a cross-sectional view of a portion of the susceptor showing laser radiation being directed over a surface of a substrate for performing laser-assisted CVD.
Figure 2B:
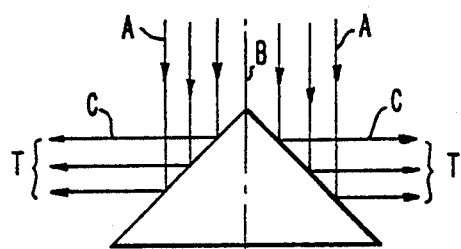
FIG. 2B is a side view of the conical reflector showing laser radiation being reflected outward as a thin, planar beam in accordance with an aspect of the invention.

As seen in FIG. 1A the reactants, such as dimethyl cadmium (DMC) and diethyl tellurium (DET), are injected at the top of the reactor 10 and are drawn down and across the substrates 16 by the viscous pumping action of the high speed horizontal rotating susceptor 14. The reactants are exhausted through an exhaust port (not shown). As the reactants enter the thin disk C of UV radiation at or just above the substrate 16 surface the reactants are decomposed by photolysis into reactive fragments or radicals. The thickness of the disk C of UV radiation is preferably made less than a distance of one mean free path for collision between two reactive fragments, or approximately 0.1 to 1.0 mm depending upon reactor 10 pressure. Thus, the reactive fragments collide with the substrate 16 before colliding with one another. In this manner homogeneous (gas phase) reactions are avoided.

Figure 3:
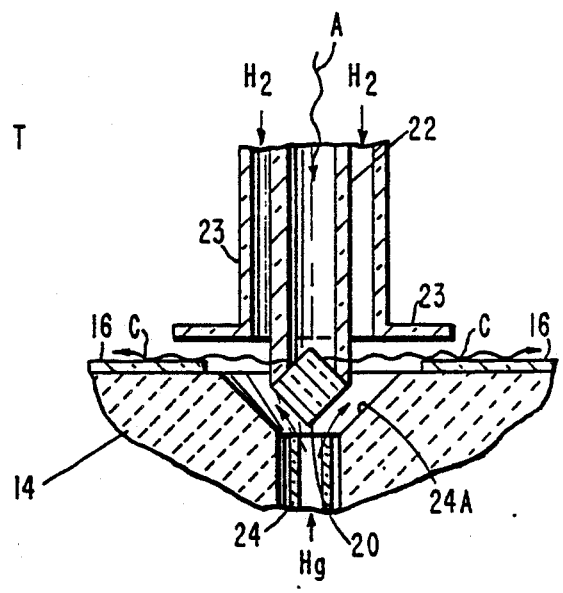
FIG. 3 is a cross sectional view of a portion of the susceptor apparatus showing in greater detail the conical reflector, lower gas delivery, radiation delivery and window purge.
Figure 4:
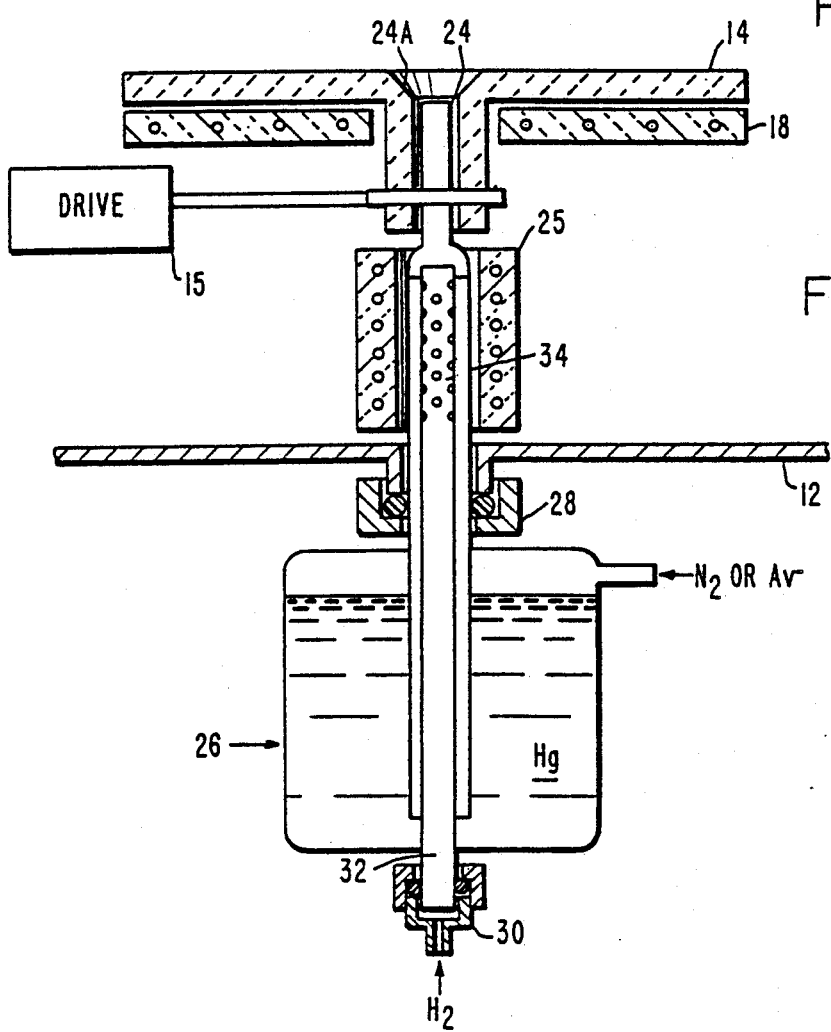
FIG. 4 is a cross sectional view showing in detail the construction of the coaxial Hg source that is another aspect of the invention.

Further in accordance with the invention a reactant gas, in this case Hg, is injected from a tube 24 that is stationary and coaxial with the rotating susceptor 14. As can be seen in FIG. 4 a heating element 25 heats tube 24 down into a Hg source, the source comprising a reservoir 26 positioned external to the stainless steel jacket of the reactor chamber 12. Injection tube 24 and source 26 are preferably fabricated from quartz instead of metal, thereby eliminating Hg contamination and improving the purity of the injected Hg. O-ring seals 28 and 30 are provided for ensuring gas tight entry to the chamber 12 for the tube 24 and also the integrity of a $H_2$ Hg carrier flow injected at the bottom of a tube 32, respectively. The tube 32 is perforated at an upper region 34, the perforations being of a size that prohibits the passage of liquid Hg but permits Hg vapor to pass. A source of inert gas, such as $N_2$ or Ar, is coupled to the reservoir 26 for pressurizing the reservoir 26. As can be seen in FIG. 3 the Hg vapor is injected into the reactor 10 from an orifice 24A within the rotating susceptor 14 at the level of the substrates 16. As result the Hg vapor is dispersed in a thin sheet over the substrates 16 by the centrifugal force of the high-speed rotating susceptor 14. As can be seen, the Hg is injected and distributed such that the Hg is concentrated at an optimum position within the disk-shaped beam C wherein photolysis is occurring. Thus, the Hg is confined in the reactor 10 to the region just above the substrates 16 and does not fill the entire volume of the reactor 10. This method of reactant molecule injection that is a feature of the invention also conserves Hg in that the entire reactor need not be pressurized with Hg in order to maintain a desired amount of Hg vapor pressure over the substrates 16. A simplification of reactor design also results in that the reactor walls are not required to be heated in order to prevent Hg condensation thereon. Furthermore, it has been found that the injection of the relatively heavy Hg atoms at a point low in the reactor chamber, that is at the susceptor 14 surface itself, increases the gas density at the susceptor 14 surface and aids in stabilizing the gas flow patterns within the reactor 10. In general, gas flow is stabilized by countering the decrease in gas density caused by heating from the susceptor 14, which in itself introduces convective instabilities. The reservoir 26 is preferably disposed external to the reactor 10 in order to facilitate the replenishment of the reactant therein.

Based on the foregoing it should be appreciated that the reactor 10 of the invention provides at least the following advantages over conventional CVD and MOCVD reactors of the type that have a horizontally rotating substrate support. First, UV radiation is provided radially along a central axis of the reactor and, due to the action of the conical reflector, the UV radiation covers a large deposition area even through it enters the reactor through an area that is comparatively much smaller than the deposition area. This technique further simplifies the problem of purging the quartz window 22 to prevent deposition thereon in that the window has a cylindrical geometry of relatively small diameter. Also, the radial configuration that is a feature of the invention is compatible with the cylindrical symmetry, high-speed rotating susceptor reactors which are known to provide high deposition efficiency and uniformity and which are readily scalable to meet high-throughput requirements. The UV radiation "disk" can be made to have a thickness, typically approximately 0.1 mm to approximately 1.0 mm, that is optimized for reactant flow pressure. The thin disk of radiation is also readily positioned just at the surface of substrates on which deposition is occurring, thereby preventing undesirable gas-phase reactions. Furthermore, the invention provides for reactant vapor, such as Hg employed for the growth of HgCdTe, to be introduced at an optimal position relative to the substrates and not elsewhere within the volume of the reactor. This aspect of the invention maintains a high Hg pressure over the substrates while simultaneously minimizing Hg consumption. Also, injection of Hg at the level of the substrates, rather than above, stabilizes the reactor flow dynamics by counter-balancing disruptive flow sources (thermally-induced buoyancy) with an increase in gas density due to the Hg injection. This compensates for the undesirable reduction of gas density near the susceptor 14 due to the elevated temperature of the susceptor. The invention further provides for a Hg source that is coaxially aligned with and positioned below the reactor 10. The Hg source is essentially contiguous with the reactor and is preferably comprised of quartz rather than steel, thus improving purity of the Hg vapor and the deposited Hg compound. Reactor design is also greatly simplified in that the reactor does not require heated walls to maintain a desired Hg pressure over the substrates.

While the invention has been particularly shown and described with respect to a presently preferred embodiment thereof wherein elemental Hg is injected at the level of the substrates, it will be understood by those skilled in the art that changes in form and details may be made therein without departing from the scope and spirit of the invention. As one example, the reactor of the invention can be employed to grow CdTe upon a substrate surface wherein a Cd-containing organometallic is flowed from above while a Te-containing organometallic is injected through the orifice 24A at the level of the substrates. In such a system modifications to the reactant feed system of FIG. 4 would provide a liquid Te organometallic bubbler system instead of the heated Hg vapor feed. As such, the invention is intended to be limited only by the claims that follow.

What is claimed is:

1. Apparatus for use in a chemical vapor deposition chamber comprising:
    means having a surface for supporting at least one substrate during a deposition of material upon a surface of the substrate, the material being obtained from reactants within the chamber; and
    means for providing a substantially planar beam of radiation substantially parallel and adjacent to the surface of the substrate, the beam photolysing the reactants to obtain the deposited material therefrom, said means for providing comprising:
        an optical conduit for delivering ultraviolet radiation to a centrally disposed region of said supporting means, said optical conduit comprising a cylindrical window that is substantially transparent to ultraviolet radiation;
        a reflector positioned relative to said conduit for reflecting the radiation received therefrom to form the substantially planar beam of radiation; and
        a gas flow conduit coaxially disposed about said optical conduit for purging said window with a gas flow to prevent the deposition of material upon said window.

2. Apparatus as set forth in claim 1 wherein said supporting means has a opening within the surface and further comprising means for delivering a gaseous flow of a reactant to the surface of said supporting means, the gaseous flow being delivered through the opening.

3. Apparatus as set forth in claim 1 wherein said supporting means is coupled to means for rotating said supporting means about a rotational axis thereof, wherein said optical conduit is disposed along the rotational axis and wherein said reflector is a conically-shaped reflector having an apex substantially coincident with the rotational axis.

4. Apparatus as set forth in claim 3 and further comprising means coupled to said optical conduit for providing an annular beam of ultraviolet radiation thereto.

5. Apparatus for use in a MOCVD reactor comprising:
    means having a surface for supporting at least one substrate during a deposition of material upon a surface of the substrate, the material being obtained from reactants that are photodissociated within the reactor, said supporting means being coupled to means for rotating said supporting means about a rotational axis thereof, said supporting means having an opening within the surface; and
    means for delivering a gaseous flow of a reactant to the surface of said supporting means, the gaseous flow being delivered through the opening, said means for delivering comprising:
    reservoir means for holding a quantity of the reactant;
    first feedtube means coupled to said reservoir means for delivering a flow of a carrier gas; and
    second feedtube means having a first end coupled to said reservoir means and a second end disposed within the opening within said supporting means for delivering a flow comprised of the carrier gas and the reactant to the surface of the supporting means;
    wherein said first feedtube means is disposed within a length of said second feedtube means and further comprising heater means disposed around at least a portion of the length of said second feedtube means that contains said first feedtube means, said heater means vaporizing reactant within the portion of the length of said second feedtube means, said first feedtube means having a plurality of perforations made therein for admitting vaporized reactant for mixture with the flow of carrier gas.

6. Apparatus as set forth in claim 5 and further comprising means for providing a substantially disk-shaped planar beam of radiation substantially parallel and adjacent the surface of the substrate, the beam photodissociating the reactants to obtain the deposited material therefrom.

7. Apparatus as set forth in claim 5 wherein said reservoir means is disposed external to said reactor.

8. Apparatus as set forth in claim 5 wherein the rotational axis passes through the opening.

9. Apparatus as set forth in claim 5 wherein the gaseous flow of reactant is comprised of Hg.

10. Radiation delivery apparatus for use in a chemical vapor deposition chamber, comprising
   a first tubular member having a longitudinal axis and comprised, at least at a second end thereof, of a material substantially transparent to radiation of interest, the first tubular member having a first end for coupling to source means for providing an annular beam of the radiation of interest; and
   a reflector optically coupled to the second end of the first tubular member, the reflector being shaped for reflecting the annular beam of radiation into a substantially disk-shaped planar beam of radiation; and
   a second tubular member disposed around at least a portion of a length of the first tubular member and having a first end coupled to a source of a gas flow and a second open end for exhausting the gas flow, the gas flow substantially preventing the deposition of material on the first tubular member during use.

11. Apparatus as set forth in claim 10 wherein the radiation of interest has a wavelength or wavelengths substantially within a range of approximately 190 nm to approximately 450 nm.

12. Apparatus as set forth in claim 11 wherein the first tubular member is comprised of quartz.

13. Apparatus as set forth in claim 10 wherein the reflector has a conical shape having an apex disposed along the axis.

* * * * *